US012581680B2

(12) United States Patent
Shi et al.

(10) Patent No.: US 12,581,680 B2
(45) Date of Patent: Mar. 17, 2026

(54) METHOD FOR MANUFACTURING SONOS MEMORY

(71) Applicant: Shanghai Huali Microelectronics Corporation, Shanghai (CN)

(72) Inventors: Tianquan Shi, Shanghai (CN); Zhenghong Liu, Shanghai (CN); Ruisheng Qi, Shanghai (CN); Haoyu Chen, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 500 days.

(21) Appl. No.: 18/361,536

(22) Filed: Jul. 28, 2023

(65) Prior Publication Data

US 2024/0145583 A1 May 2, 2024

(30) Foreign Application Priority Data

Oct. 31, 2022 (CN) .......................... 202211347575.1

(51) Int. Cl.
| | |
|---|---|
| *H10D 30/01* | (2025.01) |
| *H10B 43/35* | (2023.01) |
| *H10D 30/69* | (2025.01) |
| *H10D 64/01* | (2025.01) |

(52) U.S. Cl.
CPC ......... *H10D 30/0413* (2025.01); *H10B 43/35* (2023.02); *H10D 30/022* (2025.01); *H10D 30/69* (2025.01); *H10D 64/015* (2025.01)

(58) Field of Classification Search
CPC .............................. H10B 43/35; H10D 64/015
See application file for complete search history.

(56) References Cited

U.S. PATENT DOCUMENTS

| | | | | |
|---|---|---|---|---|
| 2015/0287811 A1* | 10/2015 | Ramkumar | ....... | H01L 21/76224 |
| | | | | 438/287 |
| 2021/0234024 A1* | 7/2021 | Daveau | ............. | H01L 21/02244 |

\* cited by examiner

*Primary Examiner* — Daniel P Shook
(74) *Attorney, Agent, or Firm* — Banner & Witcoff, Ltd.

(57) ABSTRACT

A method for manufacturing a SONOS memory discloses forming first a thin oxide layer as a sidewall protection layer and a blocking layer. This layer prevents the high dielectric-constant layer at the bottom of the stacked gate structure from being exposed on the surface. An lightly doped drain (LDD) implantation area is defined by a lateral thickness of a thin oxide layer, so that the channel width may be controlled by controlling the thickness of the thin oxide layer. Thus, the width of a current channel at the bottom of a gate is reduced under the same ion implantation condition into the active area, thereby improving a current capacity of the SONOS memory without adding any mask or photolithography step, and thus bring no additional patterning costs or active area ion implantation costs.

12 Claims, 6 Drawing Sheets

100

METHOD FOR MANUFACTURING SONOS MEMORY

CROSS-REFERENCES TO RELATED APPLICATIONS

This application claims priority to Chinese patent application No. CN202211347575.1 filed on Oct. 31, 2022, and entitled "METHOD FOR MANUFACTURING SONOS MEMORY", the disclosure of which is incorporated herein by reference in entirety.

TECHNICAL FIELD

The present application relates to semiconductor manufacturing technologies, in particular to a method for manufacturing a SONOS memory.

BACKGROUND

With continuously increasing requirements for the integration level of flash memories (flashes) in the market, contradictions among reliability in data storage, data access speed, power consumption, cell size, and other aspects of the conventional flash memories devices have become increasingly prominent. A silicon-oxide-nitride-oxide-silicon (SONOS) memory has the characteristics of a small cell size, a low operating voltage, a fast data access speed, and compatibility with the existing CMOS technology. The continuous improvement of the SONOS technology promotes the development of semiconductor memories towards targets such as miniaturization, high performance, large capacity, and low costs.

A memory cell of the SONOS memory includes two independent transistor structures, one is a select gate (SG) and the other is a storage transistor. The SONOS memory is formed on a semiconductor substrate, such as a silicon substrate, and the memory cell of SONOS memory is formed in a storage area. A logic device area is typically provided outside the storage area, and a logic device is formed in the logic area. In the storage area, a deep N-type well (DNW) is formed on the semiconductor substrate, and a P-type well 101 and an N-type well 102 are formed in the deep N-type well separately. The select gate is formed in an area of the P-type well 101, and the storage transistor is formed in an area of the N-type well 102.

The SONOS memory, which is a charge trap memory, contains a stack layer of silicon (substrate)-tunneling oxide-silicon nitride-blocking oxide-polysilicon, the SONOS gate is applied to replace a floating gate structure of a the conventional flash memory.

FIG. 1 illustrates the structure of an existing SONOS memory. The stacked gate structure of the select gate at the left side in FIG. 1 includes a blocking oxide 106, a high dielectric constant hafnium oxide ($HfO_2$) 107, a titanium nitride (TiN) 108, a polysilicon gate 109, a hard mask silicon nitride (HM SIN) 110, and a hard mask (HM) oxide 111 that are stacked bottom up sequentially.

The stacked gate structure of the storage transistor at the right side in FIG. 1 includes an ONO layer (a tunneling layer oxide 104, an electron storage area nitride 105, and the blocking oxide 106), the high dielectric constant hafnium oxide ($HfO_2$) 107, the titanium nitride (TiN) 108, the polysilicon gate 109, the hard mask silicon nitride (HM SIN) 110, and the hard mask (HM) oxide 111 that are stacked bottom up sequentially.

A condition for ion implantation in an active area 113 of the SONOS memory (shown in FIG. 4) includes first growing a layer of nitride on the surface of a wafer, and then retaining a nitride spacer 112 with a lateral thickness of about 95 Å in a sidewall area of the stacked gate structure by means of etching, with the nitride 112 in the remaining area being fully etched away.

The existing process flow of manufacturing a SONOS memory is shown in FIGS. 1-4. First, a memory substrate 100 is provided, referring to FIG. 1, the memory substrate 100 having at least a select gate (SG) area at left and a storage transistor area at right, and a shallow trench isolation (STI) is formed, in this case, the stacked gate structure (the blocking oxide 106, the high dielectric constant hafnium oxide ($HfO_2$) 107, the titanium nitride (TiN) 108, the polysilicon gate 109, the hard mask silicon nitride (HM SIN) 110, and the hard mask (HM) oxide 111 of the select gate) and the stacked gate structure (the ONO layer (the tunneling layer oxide 104, the electron storage area nitride 105, and the blocking oxide 106), the high dielectric constant hafnium oxide ($HfO_2$) 107, the titanium nitride (TiN) 108, the polysilicon gate 109, the hard mask silicon nitride (HM SIN) 110, and the hard mask (HM) oxide 111 of the storage transistor) are grown and etched, and there is no polysilicon (Poly) in a non-gate area. Then, referring to FIG. 2, the nitride 112 is deposited on the memory substrate 100, and after that, referring to FIG. 3, the nitride outside a sidewall of the stacked gate structure is removed by means of etching, leaving the nitride with a lateral thickness of about 95 Å on the periphery of the stacked gate structure as a sidewall nitride. Subsequently, referring to FIG. 4, lightly doped drain (LDD) implantation is performed on the active area, and finally annealing activation processing is performed.

However the existing SONOS memory manufacturing process has significant limitations in improving a current capacity of the SONOS memory. Since the lateral thickness of the sidewall nitride on the periphery of the stacked gate structure reaches about 95 Å, LDD implantation areas in the defined active area are far away from each other. Even if implantation angle deflection and subsequent annealing diffusion are performed, the finally formed LDD areas in the active area are still far away from each other, resulting in a long current channel, thereby severely limiting further performance improvement of the SONOS memory. If LDD implantation range in the active area is defined by directly reducing the lateral thickness of the sidewall nitride, a channel width may be reduced. However, since the sidewall nitride needs to serve as a stop layer for subsequent processes, the reduction of the lateral thickness of the sidewall nitride imposes a serious impact on the subsequent processes. Therefore, a current conventional ion implantation process limits the improvement of the current capacity of the SONOS memory.

BRIEF SUMMARY

The present application discloses a method for manufacturing a SONOS memory, which can reduce the width of a current channel at the bottom of a gate under the same active area ion implantation condition, thereby improving a current capacity of the SONOS memory without adding any mask or photolithography layer, and thus bring no additional photolithography costs or active area ion implantation costs. The method has high selectivity for a memory substrate 100, achieves a simple and stable process, and is applicable to mass production.

To solve the above technical problem, the method for manufacturing a SONOS memory provided by the present application includes the following steps:

S1, providing a memory substrate 100, the memory substrate 100 having at least a select gate area and a storage transistor area, with a shallow trench isolation being formed between the select gate area and the storage transistor area, and a stacked gate structure of a select gate and a stacked gate structure of a storage transistor being grown and etched;

S2, growing a thin oxide film 114 on the memory substrate 100, the thin oxide film 114 covering a surface of the entire memory substrate 100;

S3, apply dry etch process and wet etch process on the wafer, removing the thin oxide film 114 that does not cover sidewalls of stacked gate structures, and retaining the sidewall thin oxide film 114 that covers the sidewalls of the stacked gate structures of the select gate and storage transistor;

S4, performing lightly doped drain ion implantation on an active area 113 of a wafer;

S5, performing ion activation annealing processing on the wafer, and then removing the sidewall thin oxide film 114 by applying a wet etching method;

S6, forming a nitride spacer 112 that covers the sidewalls of the stacked gate structures of the select gate and storage transistor, the nitride spacer ($S_iN$) 112 which has a lateral thickness greater than a lateral thickness of the sidewall thin oxide film 114 formed in step S2 covering the sidewalls of the stacked gate structures of the select gate and storage transistor; and S7, performing subsequent processes.

In an example, dry etching and wet etching processing are performed on the wafer in step S3 to remove the thin oxide film 114 that does not cover the sidewalls of the stacked gate structures and retain the sidewall thin oxide film 114 that covers the sidewalls of the stacked gate structures of the select gate and storage transistor.

The sidewall thin oxide film 114 is removed by applying the wet etching method in step S5.

In an example, the thin oxide film 114 is silicon dioxide.

In an example, the stacked gate structure of the select gate comprises a blocking oxide 106, a high dielectric constant layer 107, a titanium nitride layer 108, a polysilicon gate 109, a hard mask silicon nitride 110, and a hard mask oxide 111 that are stacked sequentially from bottom to top.

The stacked gate structure of the storage transistor is composed of a tunneling layer oxide 104, an electron storage area nitride 105, the blocking oxide 106, a high dielectric constant layer 107, a titanium nitride layer 108, a poly silicon gate 109, the hard mask silicon nitride 110, and the hard mask oxide 111 that are stacked sequentially from bottom to top.

In an example, the nitride is deposited on the wafer in step S6; then the nitride outside the sidewalls of the stacked gate structures is removed by means of etching, leaving the nitride on the periphery of the stacked gate structures as the nitride spacer 112.

In an example, the lateral thickness of the sidewall thin oxide film 114 formed in step S2 and covering the sidewalls of the stacked gate structures of the select gate and the storage transistor is in a range of 70-110 Å.

In an example, the lateral thickness of the sidewall thin oxide film 114 formed in step S2 and covering the sidewalls of the stacked gate structures of the select gate and the storage transistor is in a range of 25-35 Å.

The lateral thickness of the nitride spacer 112 formed in step S6 and covering the sidewalls of the stacked gate structures of the select gate and the storage transistor is in a range of 90-100 Å.

In an example, a CVD, PVD, or ALD process is applied in step S2 to form the sidewall thin oxide film 114 covering the sidewalls of the stacked gate structures of the select gate and the storage transistor.

In an example, the active area LDD ion implantation is performed on the semiconductor substrate in step S4, with an implantation angle α, from the norm of the substrate, ranging from 15° to 20°, and an implantation dose ranging from $2.5*10^{14}$ to $3.5*10^{14}$ ions/cm$^2$.

In an example, a P-type well 101 and an N-type well 102 are formed on the memory substrate 100 separately.

The select gate is formed in an area of the P-type well 101, and the storage transistor is formed in an area of the N-type well 102.

In step S4, N-type active area LDD ion implantation is performed on the select gate area, and P-type active area LDD ion implantation is performed on the storage transistor area.

In an example, an etching gas is applied in the etch.

A chemical acid agent is applied in removal in the wet etching method.

According to the method for manufacturing a SONOS memory in the present application, based on structural characteristics of a device, for an LDD ion implantation process that affects current performance of the SONOS memory, a thin oxide layer is first applied as a sidewall protection layer and a blocking layer. That is, a high dielectric constant (HK) dielectric at the bottom of a stacked gate structure is prevented from being exposed on a surface, and LDD implantation area is defined by means of a lateral thickness of the thin oxide layer, so that a channel width may be controlled by controlling the thickness of the thin oxide layer. As such, the width of a current channel at the bottom of a gate is reduced under the same active area ion implantation condition (implantation angle, implantation dose, etc.), thereby improving a current capacity of the SONOS memory without adding any mask or photolithography layer (photo layer), and thus bring no additional photolithography costs or active area ion implantation costs. The method has high selectivity for the memory substrate 100, achieves a simple and stable process, and is applicable to mass production.

BRIEF DESCRIPTION OF THE DRAWINGS

In order to more clearly explain the technical solutions of the present application, the drawings required by the present application will be briefly described below. It is obvious that the drawings described below are merely some embodiments of the present application, and those skilled in the art could also obtain other drawings on the basis of these drawings without the practice of inventive effort.

DETAILED DESCRIPTION OF THE DISCLOSURE

The technical solutions in the embodiments of the present application will be clearly and completely described below in conjunction with the drawings. Obviously, the described embodiments are only part of the embodiments of the present application, rather than all of the embodiments. Based on the embodiments in the present application, all other embodiments obtained by those skilled in the art without the practice of inventive effort shall fall into the protection scope of the present application.

The terms such as "first" and "second" used in the present application do not indicate any order, quantity, or importance, but are only used to distinguish different constituent parts. The terms such as "include" or "comprise" means that the components or objects in front of these terms cover the components or objects listed after the terms and equivalents thereof, without excluding other components or objects. The terms such as "connection" or "coupling" are not limited to physical or mechanical connections, but may include electrical connections, whether direct or indirect. The terms "up", "down", "left", "right", etc. are only used to represent relative positional relationships, which may change accordingly after absolute positions of the described objects change.

It should be noted that the embodiments or features in the embodiments of the present application may be combined with each other in the case of no conflict.

Embodiment 1

Figure 1:
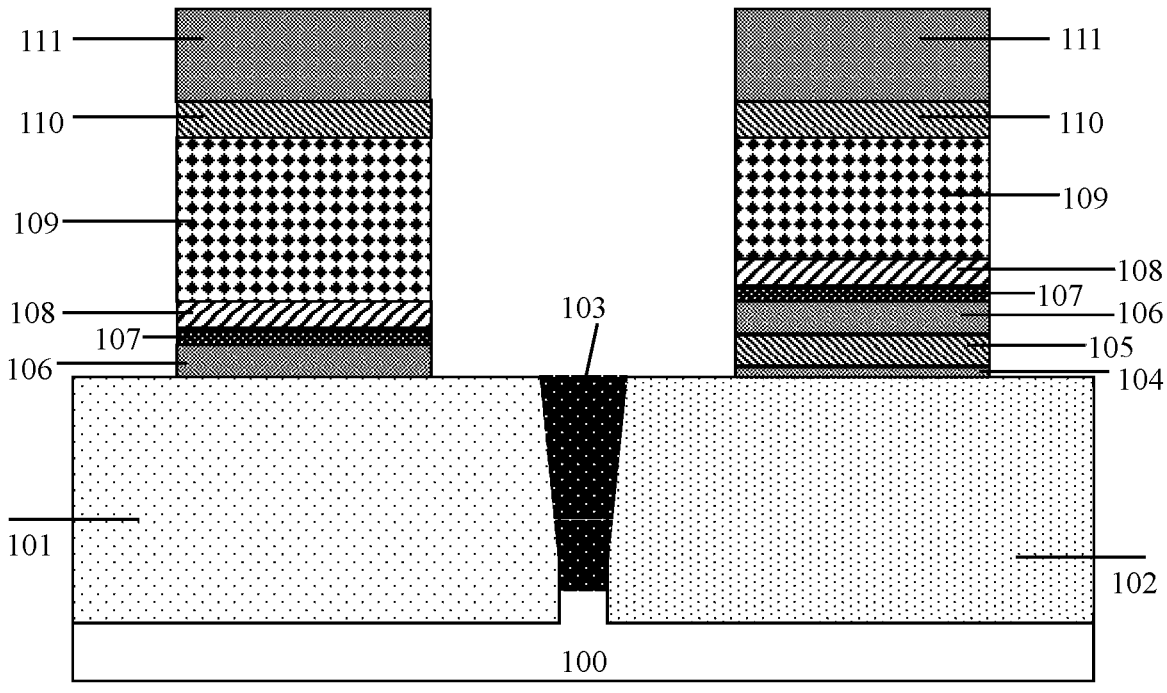
FIG. 1 is a cross sectional view of a SONOS memory substrate.
Figure 2:
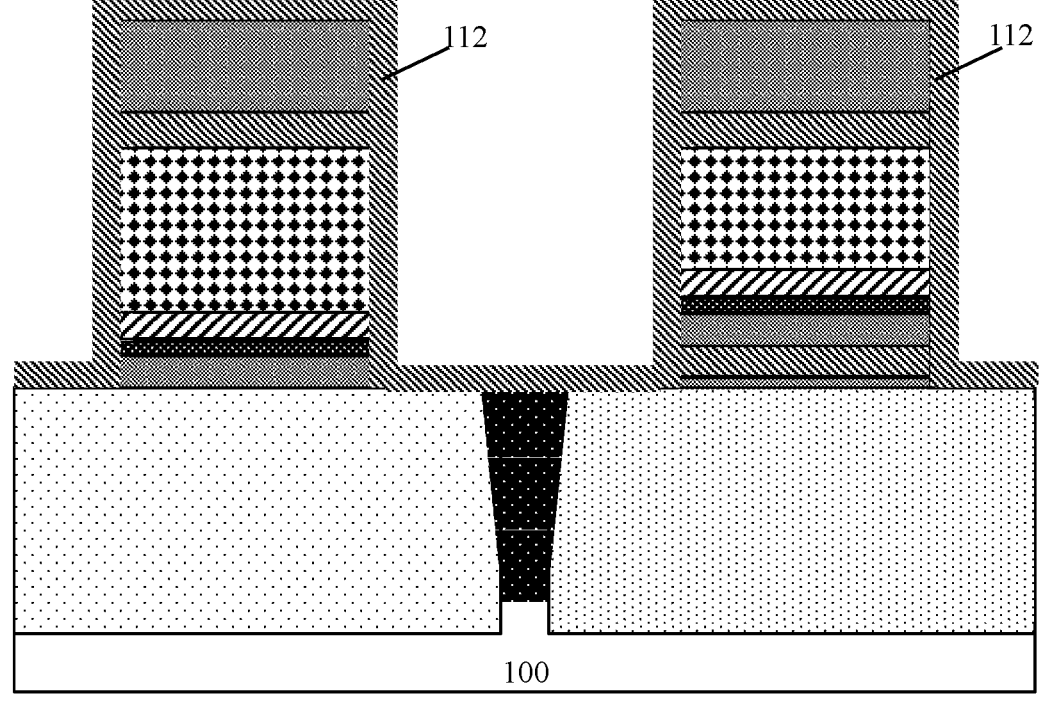
FIG. 2 is a schematic diagram of the structure after depositing a nitride layer on a memory substrate in an existing SONOS memory manufacturing process.
Figure 3:
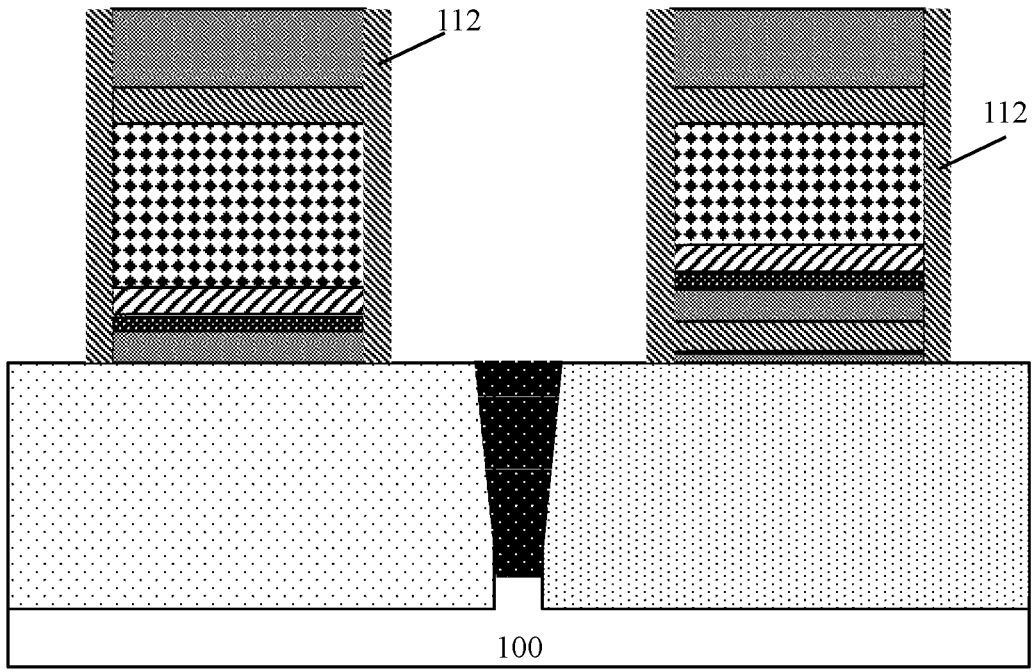
FIG. 3 is a schematic diagram of removing a nitride outside a sidewall of a stacked gate structure in the existing SONOS memory manufacturing process.
Figure 4:
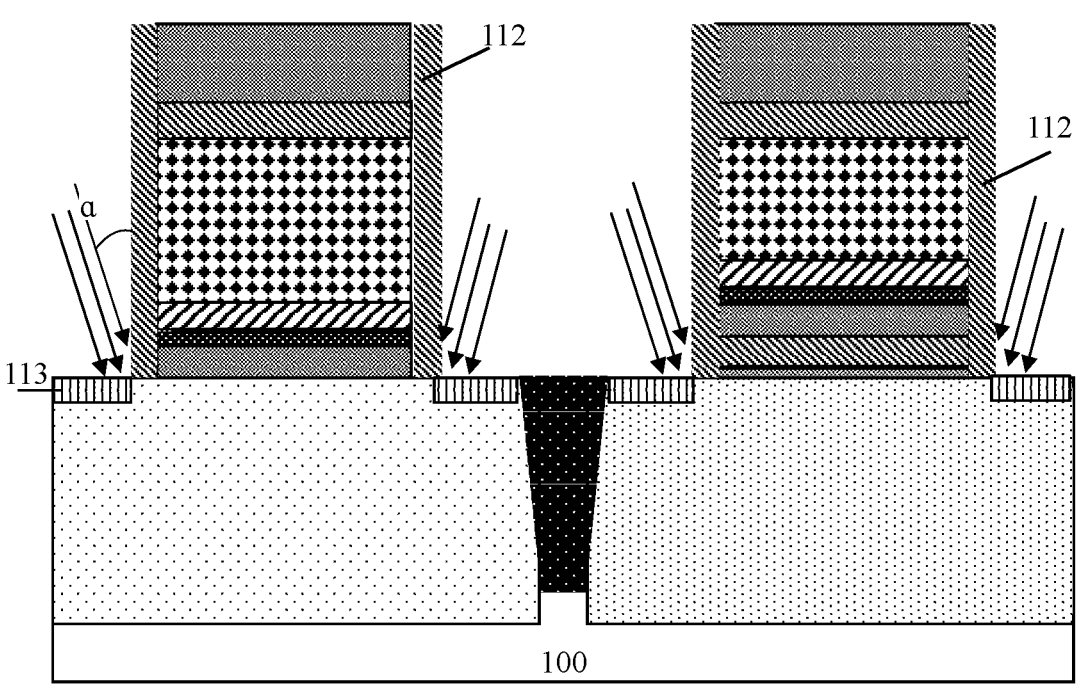
FIG. 4 is a schematic diagram obtained after performing an active area LDD implantation in the existing SONOS memory manufacturing process.
Figure 5:
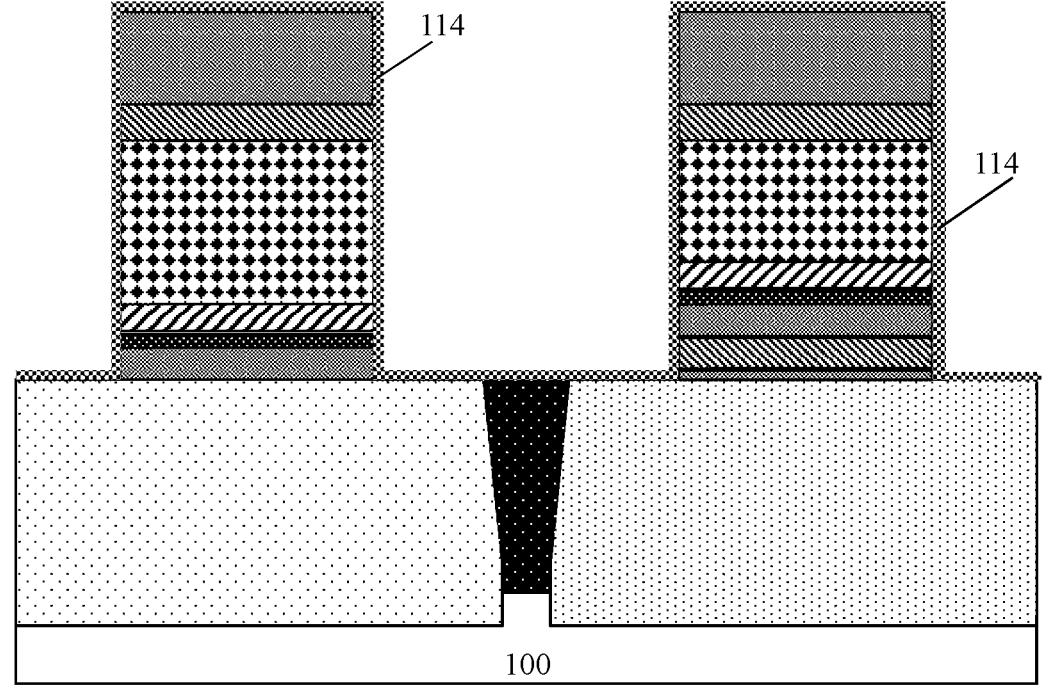
FIG. 5 is a schematic diagram obtained after growing a thin oxide film on a memory substrate in a method for manufacturing a SONOS memory according to an embodiment of the present application.

Referring to FIG. 5, a method for manufacturing a SONOS memory includes the following steps:

S1. A memory substrate 100 is provided, referring to FIG. 1, the memory substrate 100 having at least a select gate (SG) area and a storage transistor area, with a shallow trench isolation (STI) being formed between the select gate area and the storage transistor area, a stacked gate structure of a select gate and a stacked gate structure of a storage transistor being grown and formed, and no polysilicon (poly) being present in the non-gate area.

S2. A thin oxide film 114 is grown on the memory substrate 100, the thin oxide film 114 covering the surface of the entire memory substrate 100, referring to FIG. 5.

Figure 6:
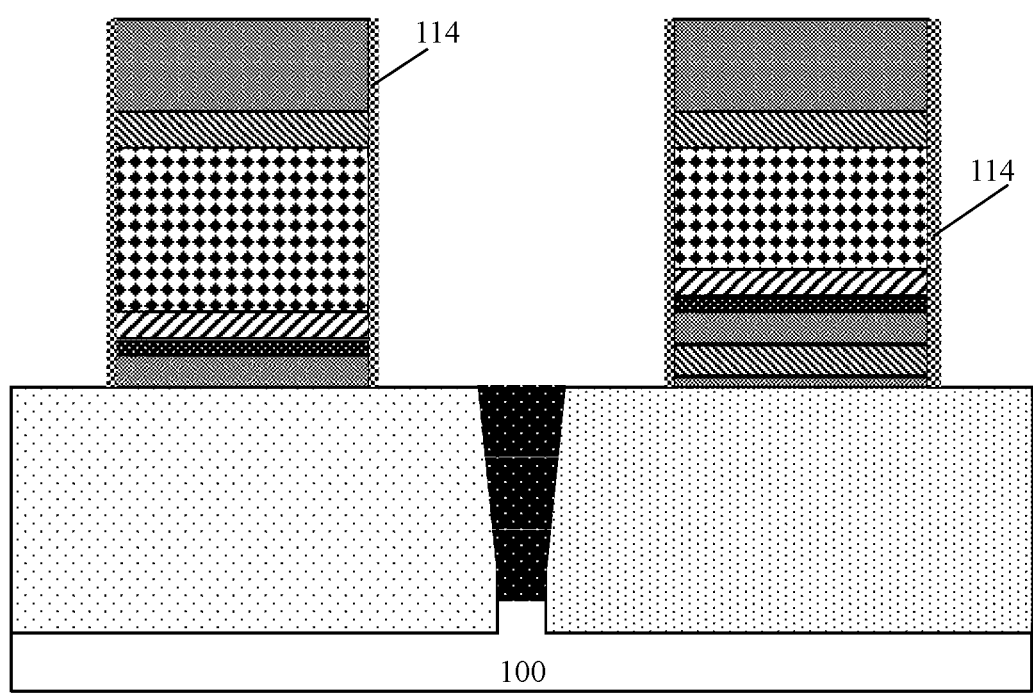
FIG. 6 is a schematic diagram obtained after removing the thin oxide film that is not disposed on the sidewalls of the stacked gate structures but retaining the thin oxide film on the sidewalls of the stacked gate structures in the method for manufacturing a SONOS memory according to an embodiment of the present application.

S3. Dry etch process and wet etch process are applied on the wafer, the thin oxide film 114 that does not cover sidewalls of stacked gate structures is removed by the etch processes, and the thin oxide film 114 on sidewalls that covers the sidewalls of the stacked gate structures of the select gate and storage transistor is retained, referring to FIG. 6.

Figure 7:
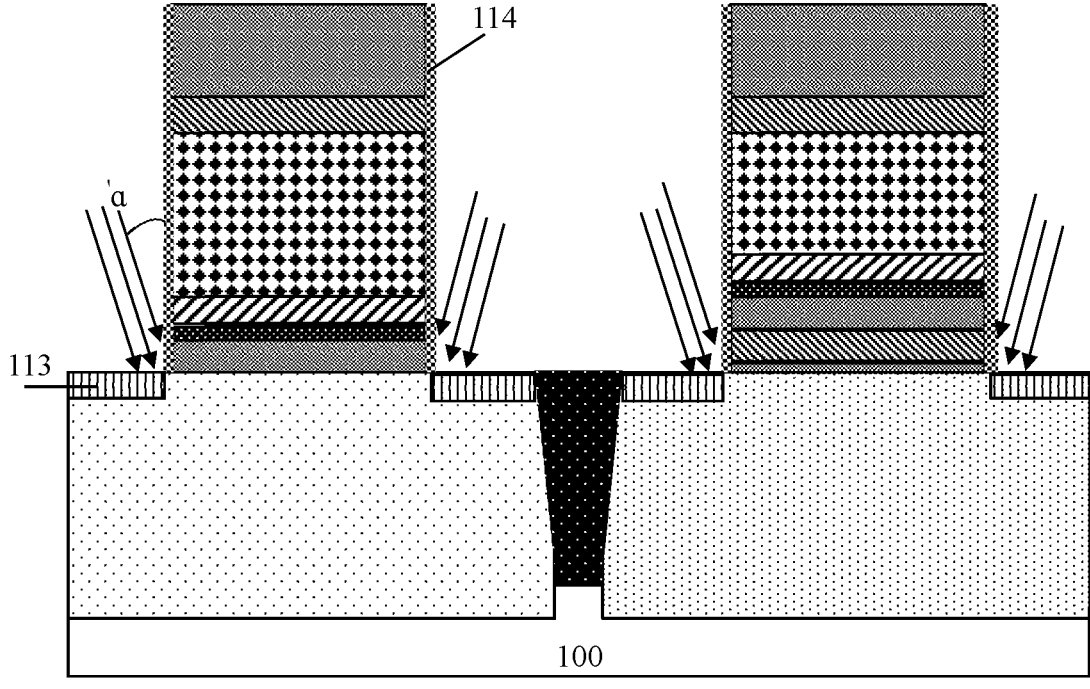
FIG. 7 is a schematic diagram of performing lightly doped drain ion implantation on an active area of a wafer in the method for manufacturing a SONOS memory according to an embodiment of the present application.

S4. Lightly doped drain (LDD) ion implantation is performed on an active area 113 of a wafer, referring to FIG. 7.

Figure 8:
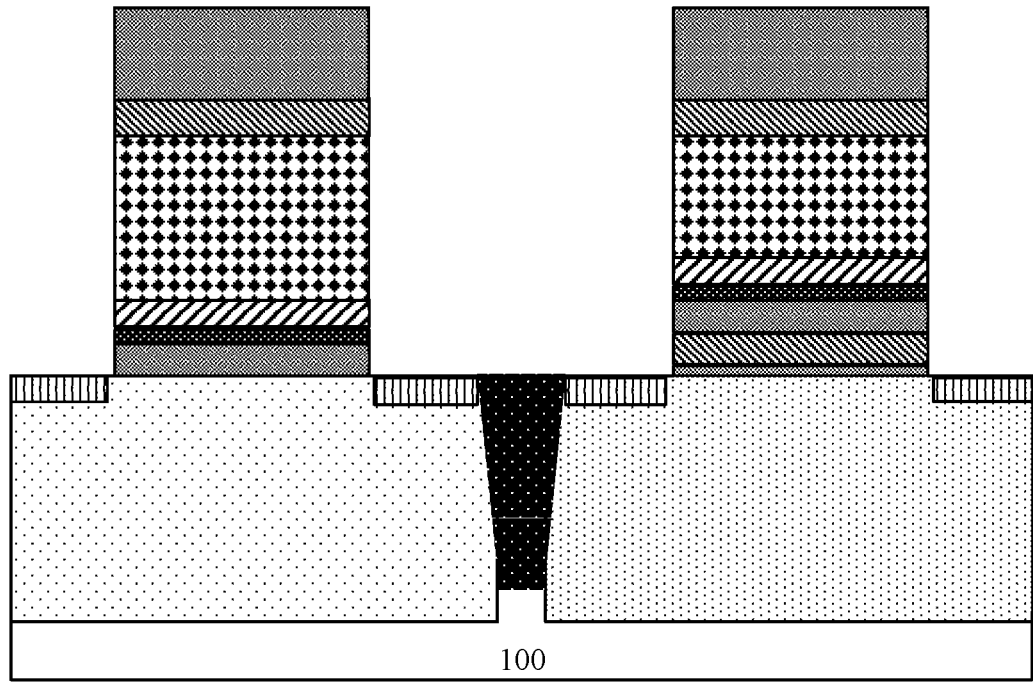
FIG. 8 is a schematic diagram obtained after performing ion activation annealing process on the wafer and removing thin oxide film from the sidewalls in the method for manufacturing a SONOS memory according to an embodiment of the present application.

S5. Ion activation annealing processing is performed on the wafer, and then a wet etch method is applied in removal of the sidewall thin oxide film 114, referring to FIG. 8.

Figure 9:
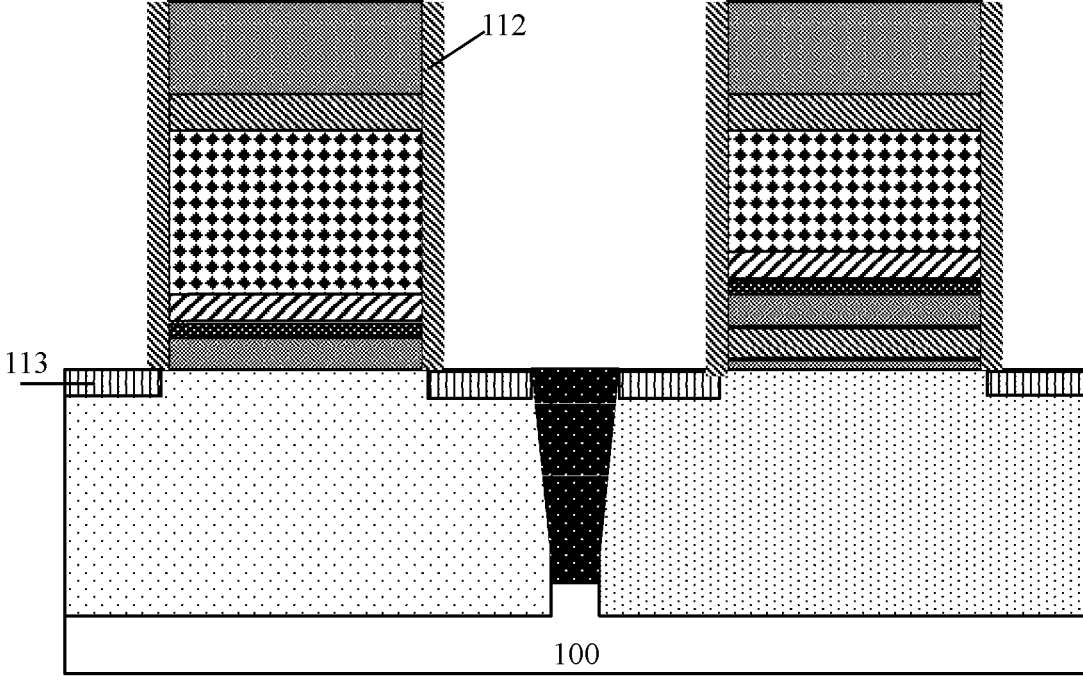
FIG. 9 is a schematic diagram obtained after forming a nitride spacer spacer in the method for manufacturing a SONOS memory according to an embodiment of the present application.

S6. A nitride spacer ($S_iN$) 112 that covers the sidewalls of the stacked gate structures of the select gate and storage transistor is formed, the nitride spacer ($S_iN$) 112 having a lateral thickness greater than a lateral thickness of the sidewall thin oxide film 114 formed in step S2 and covering the sidewalls of the stacked gate structures of the select gate and storage transistor, referring to FIG. 9.

S7. Subsequent processes are performed.

The thin oxide film 114 may be silicon dioxide or other oxide insulating media.

According to the method for manufacturing a SONOS memory in Embodiment 1, the thin oxide film 114 is first grown on the memory substrate 100 such that the thin oxide film 114 fully covers the sidewalls of the stacked gate structures of the select gate and storage transistor, and then etch processing is performed such that the lateral width of the remaining oxide film 114 that covers the sidewalls of the stacked gate structures is about 30 Å, and the oxide 112 in the other areas is fully removed. Then the active area LDD implantation and annealing activation processing are performed on a surface of the wafer. After that, a conventional nitride spacer formation process is carried out, in which case a high current capacity LDD implantation process of the SONOS memory is completed.

According to the method for manufacturing a SONOS memory in Embodiment 1, a thin oxide sidewall is first generated on the memory substrate 100, which protects a high dielectric constant (HK) dielectric layer and poly silicon gate (poly gate) of the stacked gate structure while isolating a material of the high dielectric constant (HK) dielectric layer at the bottom of the stacked gate structure from the outside, thereby ensuring that a contamination level of the wafer is consistent with a standard. Then the lightly doped drain (LDD) ion implantation process is performed on the active area.

According to the method for manufacturing a SONOS memory in Embodiment 1, based on structural characteristics of a device, for an LDD ion implantation process that affects current performance of the SONOS memory, a thin oxide layer is first applied as a sidewall protection layer and a blocking layer. That is, a high dielectric constant (HK) dielectric at the bottom of a stacked gate structure is prevented from being exposed on a surface, and LDD implantation area is defined by means of a lateral thickness of the thin oxide layer, so that a channel width may be controlled by controlling the thickness of the thin oxide layer. As such, the width of a current channel at the bottom of a gate is reduced under the same active area ion implantation condition (implantation angle, implantation dose, etc.), thereby improving a current capacity of the SONOS memory without adding any mask or photolithography layer (photo layer), and thus bring no additional photolithography costs or active area ion implantation costs. The method has high selectivity for the memory substrate 100, achieves a simple and stable process, and is applicable to mass production.

Embodiment 2

According to the method for manufacturing a SONOS memory in Embodiment 1, the stacked gate structure of the select gate is composed of a blocking oxide 106, a high dielectric constant layer 107, a titanium nitride (TiN) layer 108, a polysilicon gate 109, a hard mask silicon nitride (HM S$_j$N) 110, and a hard mask (HM) oxide 111 that are stacked sequentially from bottom to top.

The stacked gate structure of the storage transistor is composed of a tunneling layer oxide 104, an electron storage area nitride 105, the blocking oxide 106, a high dielectric constant layer 107, a titanium nitride layer 108, a poly silicon gate 109, the hard mask silicon nitride 110, and the hard mask oxide 111 that are stacked sequentially from bottom to top.

In an example, the high dielectric constant layer 107 is hafnium oxide (HfO$_2$).

In an example, the nitride is deposited on the wafer in step S6; then the nitride outside the sidewalls of the stacked gate structures is removed by means of etching, leaving the nitride on the periphery of the stacked gate structures as the nitride spacer 112.

In an example, the lateral thickness of the sidewall thin oxide film 114 formed in step S2 and covering the sidewalls of the stacked gate structures of the select gate and the storage transistor is in a range of 10-50 Å.

The lateral thickness of the nitride spacer 112 formed in step S6 and covering the sidewalls of the stacked gate structures of the select gate and the storage transistor is in a range of 70-110 Å.

In an example, the lateral thickness of the sidewall thin oxide film 114 formed in step S2 and covering the sidewalls of the stacked gate structures of the select gate and the storage transistor is in a range of 25-35 Å (e.g., 30 Å).

The lateral thickness of the nitride spacer 112 formed in step S6 and covering the sidewalls of the stacked gate structures of the select gate and the storage transistor is in a range of 90-100 Å (e.g., 95 Å).

In an example, a chemical vapor deposition (CVD), physical vapor deposition (PVD), or an atomic layer deposition (ALD) process is applied in step S2 to form the sidewall thin oxide film 114 covering the sidewalls of the stacked gate structures of the select gate and the storage transistor.

In an example, the active area LDD ion implantation is performed on the semiconductor substrate in step S4, with an implantation angle α, from the norm of the substrate, ranging from 15° to 20°, and the implantation dose ranging from 2.5*10$^{14}$ to 3.5*10$^{14}$ ions/cm$^2$.

In an example, a P-type well 101 and an N-type well 102 are formed on the memory substrate 100 separately.

The select gate is formed in an area of the P-type well 101, and the storage transistor is formed in an area of the N-type well 102.

In step S4, N-type active area LDD ion implantation is performed on the select gate (SG) area, and P-type active area LDD ion implantation is performed on the storage transistor area.

In an example, an etching gas is applied in the dry etch, and a chemical acid agent is applied in removal oxide films in the wet etch method.

The above description is merely examples of the embodiments of the present application and not intended to limit the present application. Any modifications, equivalent substitutions, improvements, etc. made within the spirit and principles of the present application shall be included within the protection scope of the present application.

What is claimed is:

1. A method for manufacturing a SONOS memory, comprising following steps:

S1, providing a memory substrate (100) in a wafer, forming a select gate area and a storage transistor area on the memory substrate (100); forming a shallow trench isolation between the select gate area and the storage transistor area in the memory substrate; and forming a stacked gate structure of a select gate and a stacked gate structure of a storage transistor by a film stacking process and an patterning process;

S2, growing a thin oxide film (114) on the memory substrate (100), wherein the thin oxide film (114) is disposed on a full surface of the memory substrate (100);

S3, removing the thin oxide film (114) that does not cover sidewalls of the stacked gate structures, and retaining the thin oxide film (114) on surfaces of sidewalls of the stacked gate structures of the select gate and the storage transistor; S4, performing lightly doped drain ion implantation on an active area (113) of the wafer;

S5, performing ion activation annealing process on the wafer, and then removing the thin oxide film (114);

S6, forming a nitride spacer (112) to cover the sidewalls of the stacked gate structures of the select gate and storage transistor, wherein the nitride spacer (112) having a lateral thickness greater than a lateral thickness of the thin oxide film (114) on the sidewalls of the stacked gate structures of the select gate and storage transistor; and S7, performing subsequent processes.

2. The method for manufacturing the SONOS memory according to claim 1, wherein step S3 further comprises applying a dry etching process and a wet etching process to remove the thin oxide film (114) that does not cover the sidewalls of the stacked gate structures, wherein the dry and wet etching processes retain the thin oxide film (114) on the sidewalls of the stacked gate structures of the select gate and the storage transistor; and wherein step S5 further comprises removing the thin oxide film (114) from the sidewalls of the stacked gate structure of the select gate and the stacked gate structure of the storage transistor by applying the wet etching process.

3. The method for manufacturing the SONOS memory according to claim 1, wherein the thin oxide film (114) comprises silicon dioxide.

4. The method for manufacturing the SONOS memory according to claim 1, wherein the stacked gate structure of the select gate comprises: a blocking oxide layer (106), a high dielectric constant layer (107), a titanium nitride layer (108), a polysilicon gate (109), a hard mask layer comprising silicon nitride (110), and a hard mask layer comprising oxide (111), all stacked together sequentially from bottom to top; and wherein the stacked gate structure of the storage transistor comprises: a tunneling oxide layer (104), an electron storage area nitride layer (105), the blocking oxide layer (106), a high dielectric constant layer (107), a titanium nitride layer (108), a poly silicon gate (109), the hard mask layer comprising silicon nitride (110), and the hard mask layer comprising oxide (111), all stacked together sequentially from bottom to top.

5. The method for manufacturing the SONOS memory according to claim 3, wherein the high dielectric constant layer is hafnium oxide.

6. The method for manufacturing the SONOS memory according to claim 1, wherein forming the nitride spacer in step S6 comprises depositing a nitride layer on the wafer;

removing the nitride layer that does not cover the sidewalls of the stacked gate structures by applying an etching process, and leaving the remaining nitride layer on a periphery of the stacked gate structures as the spacer nitride (112).

7. The method for manufacturing the SONOS memory according to claim 1, wherein a lateral thickness of the thin oxide film (114) formed in step S2 on the sidewalls of the stacked gate structures of the select gate and the storage transistor is in a range of 10-50 Å; and wherein a lateral thickness of the nitride spacer (112) formed in step S6 on the sidewalls of the stacked gate structures of the select gate and the storage transistor is in a range of 70-110 Å.

8. The method for manufacturing the SONOS memory according to claim 7, wherein the lateral thickness of the thin oxide film (114) formed in step S2 on the sidewalls of the stacked gate structures of the select gate and the storage transistor is in a range of 25-35 Å; and wherein the lateral thickness of the nitride spacer (112) formed in step S6 on the sidewalls of the stacked gate structures of the select gate and the storage transistor is in a range of 90-100 Å.

9. The method for manufacturing the SONOS memory according to claim 7, wherein a CVD, a PVD, or an ALD process is applied in step S2 to form the thin oxide film (114) on the sidewalls of the stacked gate structures of the select gate and the storage transistor.

10. The method for manufacturing the SONOS memory according to claim 7, wherein the active area LDD ion implantation is performed on the semiconductor substrate in step S4, with an implantation angle $\alpha$ ranging from 15° to 20°, and an implantation dose ranging from $2.5 \times 10^{14}$ to $3.5 \times 10^{14}$ ions/cm$^2$.

11. The method for manufacturing the SONOS memory according to claim 7, further comprising:

forming a P-type well (101) and an N-type well (102) on the memory substrate (100) separately;

forming the select gate in an area of the P-type well (101); and forming the storage transistor in an area of the N-type well (102);

wherein step S4 further comprises performing N-type active area LDD ion implantation on the select gate area, and performing P-type active area LDD ion implantation on the storage transistor area.

12. The method for manufacturing the SONOS memory according to claim 7, wherein an etching gas is applied in the dry etch process; and a chemical acid agent is applied in the removal of the thin oxide film in the wet etch process.

* * * * *